I
US010763899B1

(12) United States Patent
Cetinoneri et al.

(10) Patent No.: US 10,763,899 B1
(45) Date of Patent: Sep. 1, 2020

(54) RADIO-FREQUENCY INTEGRATED CIRCUIT (RFIC) EXTERNAL FRONT-END MODULE

(71) Applicant: Apple Inc., Cupertino, CA (US)

(72) Inventors: Berke Cetinoneri, Santa Clara, CA (US); Qishan Yu, San Jose, CA (US); Samia El Amrani, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/584,176

(22) Filed: Sep. 26, 2019

(51) Int. Cl.
*H04B 1/00* (2006.01)
*H03F 3/213* (2006.01)
*H03F 3/21* (2006.01)

(52) U.S. Cl.
CPC ............ *H04B 1/006* (2013.01); *H03F 3/211* (2013.01); *H03F 3/213* (2013.01); *H03F 2200/294* (2013.01); *H03F 2200/451* (2013.01)

(58) Field of Classification Search
CPC ......... H04B 1/006; H03F 3/213; H03F 3/211; H03F 2200/451; H03F 2200/294
See application file for complete search history.

(56) References Cited

U.S. PATENT DOCUMENTS

| 9,866,259 | B1* | 1/2018 | Margomenos | ....... H05K 999/99 |
|---|---|---|---|---|
| 10,200,183 | B2* | 2/2019 | Liu | ........ H04L 5/1461 |
| 10,223,965 | B2* | 3/2019 | Bi | ......... G09G 3/3233 |
| 2008/0205509 | A1* | 8/2008 | Le Naour | ........ H04B 7/08 |
| | | | | 375/240.01 |
| 2009/0153425 | A1* | 6/2009 | Le Naour | ........ H01Q 13/085 |
| | | | | 343/770 |
| 2014/0038532 | A1* | 2/2014 | George | ........ H04B 1/006 |
| | | | | 455/78 |
| 2016/0285490 | A1* | 9/2016 | Hanaoka | ........ H04B 1/006 |
| 2017/0063404 | A1* | 3/2017 | Langer | ........ H04B 1/0057 |
| 2018/0226367 | A1* | 8/2018 | Babcock | ........ H04B 1/0475 |
| 2018/0241369 | A1* | 8/2018 | Ghim | ........ H04B 1/28 |
| 2018/0331434 | A1* | 11/2018 | Iiduka | ........ H04B 1/40 |
| 2018/0343001 | A1* | 11/2018 | Srirattana | ........ H04B 1/48 |
| 2019/0044577 | A1* | 2/2019 | Kim | ........ H04B 7/0626 |
| 2019/0097671 | A1* | 3/2019 | Dimpflmaier | ........ H03F 3/72 |
| 2019/0379130 | A1* | 12/2019 | Kang | ........ H04B 1/525 |
| 2020/0127698 | A1* | 4/2020 | Cho | ........ H04L 5/0051 |

* cited by examiner

*Primary Examiner* — Devan A Sandiford
(74) *Attorney, Agent, or Firm* — Fletcher Yoder PC (57) ABSTRACT

Systems and methods for driving using a radio-frequency integrated circuit to drive one or more front end modules. The front end modules provide signal flexibility to an electronic device. The radio-frequency integrated circuit drives the one or more front end modules via dual-pole, dual-throw switches that enable a pair of radio-frequency chains in the radio-frequency integrated circuit to drive two pairs of radio-frequency chains in each of two connected front end modules.

20 Claims, 12 Drawing Sheets

FIG. 11B

RADIO-FREQUENCY INTEGRATED CIRCUIT (RFIC) EXTERNAL FRONT-END MODULE

BACKGROUND

The present disclosure relates generally to wireless communication systems and, more specifically, to systems and methods for driving multiple external front-end modules (eFEM) using a radio-frequency integrated circuit (RFIC).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

RFICs have a number of RF chains each used to drive a respective RF chain in respective eFEMs. However, the number of RF chains that the RFIC is able to drive may limit a number of eFEMs that may be included in an electronic device that has the RFIC. In other words, the number of additional eFEMs may be limited by the number of available RF chains in the RFIC, and adding more RFICs may be impossible and/or impractical due to size limits in the electronic device. In addition, the routing path of each RF chain from RFIC to eFEM can be challenging given the space constraints in an electronic device, and routing each path can complicate a printed circuit board (PCB) layout of the electronic device.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

RFICs may utilize multi-pole, multi-throw (MPMT) switches (e.g., dual-pole, dual-throw (DPDT) switches) that enable a single RFIC to increase the number of RF chains for a given number of I/O ports and, thus, the number of eFEMs that may be driven by the RFIC. For instance, a DPDT switch may selectively couple two RF chains of the RFIC to two respective RF chains in a first eFEM and to two respective RF chains in a second eFEM. The signals from the DPDT switch are received at switches in the eFEMs. The switches in the eFEMs route the signals to appropriate RF chains in the eFEMs.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Electronic devices may utilize radio-frequency integrated circuits (RFIC) with multiple radio-frequency (RF) chains each having an amplifier pair that includes an incoming amplifier and/or receiver and an outgoing amplifier and/or transmitter. RFICs use the RF chains to drive a respective RF chain in respective external front-end module (eFEMs) that are used to provide communication flexibility in the electronic device. However, the number of RF chains that the RFIC can drive may be limited. This limited number of RF chains may limit a number of eFEMs that may be included in an electronic device that has the RFIC. The addition of more eFEMs may be limited by the number of available RF chains in the RFIC, and adding more RFICs may be impossible and/or impractical due to size and/or power limits in the electronic device.

To increase a number of eFEMs in a device, RFICs may utilize multi-pole multi-throw (e.g., dual-pole, dual-throw (DPDT)) switches that enable a single RFIC to increase a number of RF chains and their eFEMs that may be driven by the RFIC. For instance, a DPDT switch may selectively couple two amplifier pairs of two RF chains of the RFIC to two RF chains in each of two different eFEMs. The signals from the DPDT switch are received at switches in the eFEMs. The switches in the eFEMs route the signals to appropriate RF chains in the eFEMs.

Figure 1:
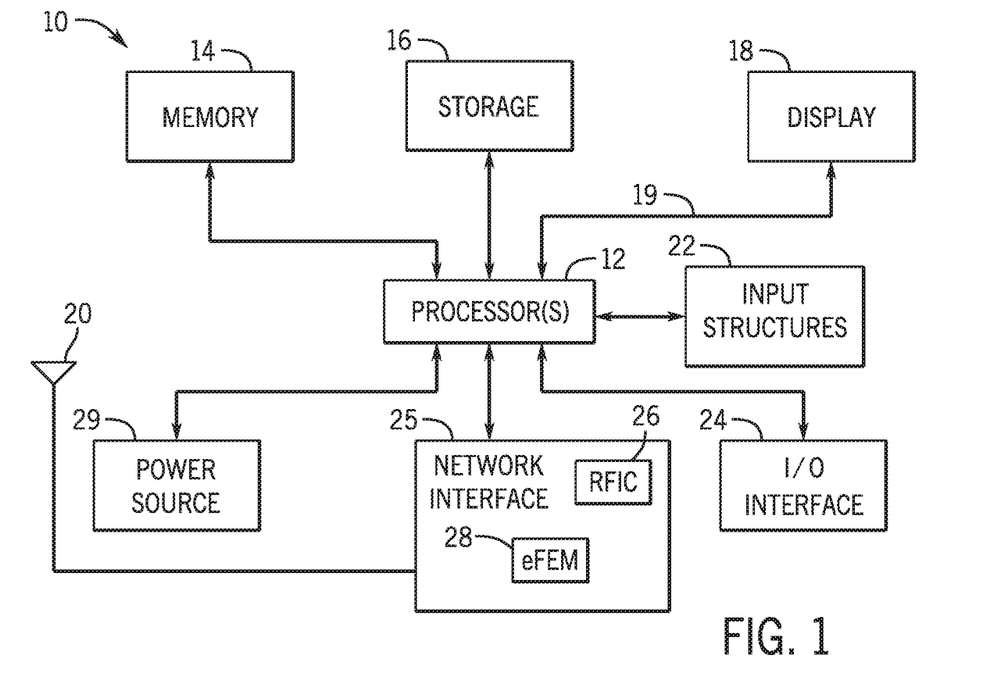
FIG. 1 is a block diagram of an electronic device that includes a radio-frequency integrated circuit (RFIC) that drives one or more external front-end modules (eFEMs), in accordance with an embodiments of the present disclosure.

With the foregoing in mind, there are many suitable electronic devices that may benefit from the embodiments of RFICs driving eFEMs in the manner discussed herein. Turning first to FIG. 1, an electronic device 10 according to an embodiment of the present disclosure may include, among other things, one or more processor(s) 12, memory 14, nonvolatile storage 16, a display 18, one or more antennas 20, input structures 22, an input/output (I/O) interface 24, a network interface 25 having one or more RFICs 26 and one or more eFEMs 28 coupled to the antenna(s) 20, and a power source 29. The various functional blocks shown in FIG. 1 may include hardware elements (including circuitry), software elements (including computer code stored on a computer-readable medium), or a combination of both hardware and software elements. It should be noted that FIG. 1 is merely one example of a particular implementation and is intended to illustrate the types of components that may be present in electronic device 10.

Figure 2:
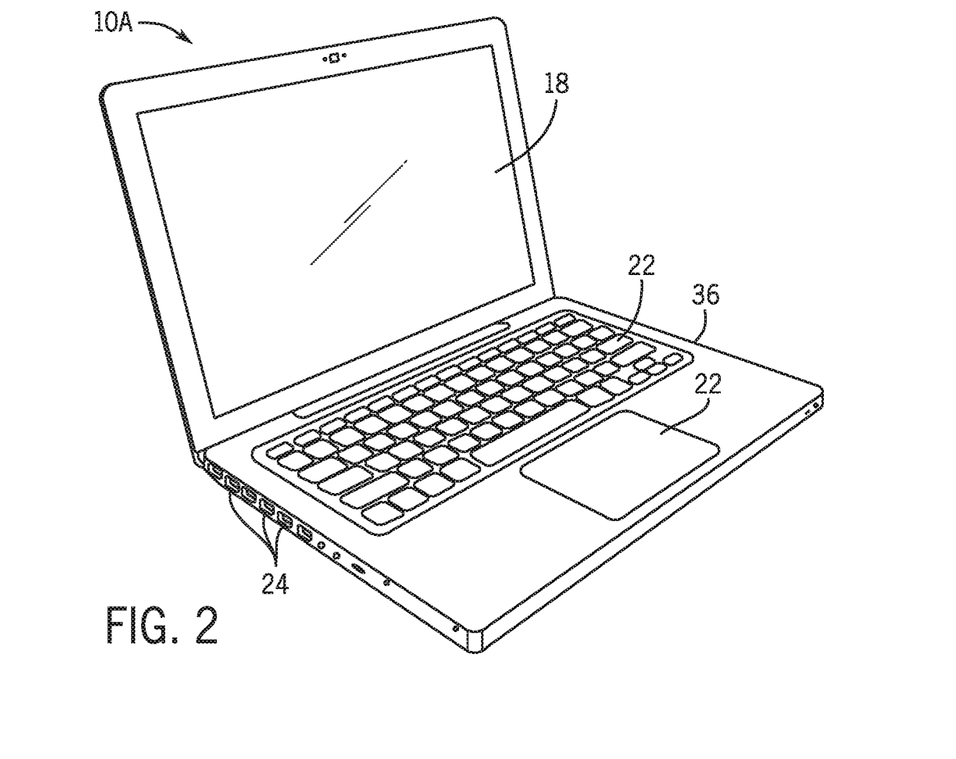
FIG. 2 is a perspective view of a notebook computer representing an embodiment of the electronic device of FIG. 1.
Figure 3:
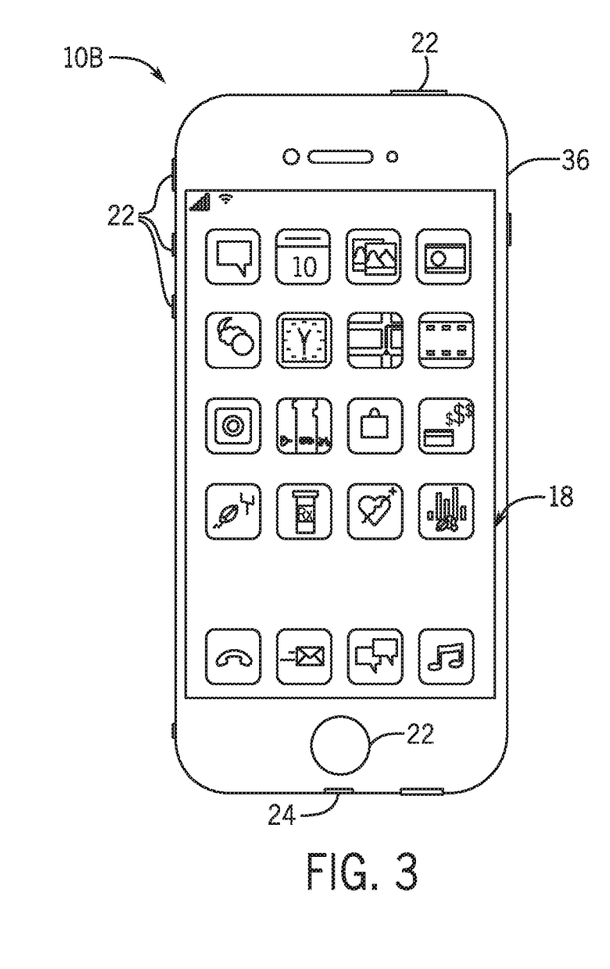
FIG. 3 is a front view of a hand-held device representing another embodiment of the electronic device of FIG. 1.
Figure 4:
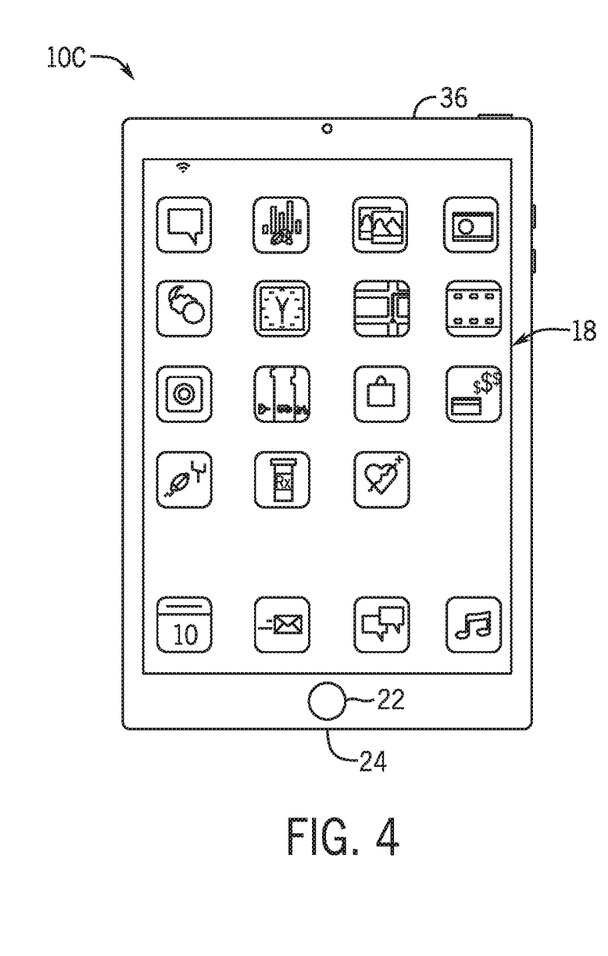
FIG. 4 is a front view of another hand-held device representing another embodiment of the electronic device of FIG. 1.
Figure 5:
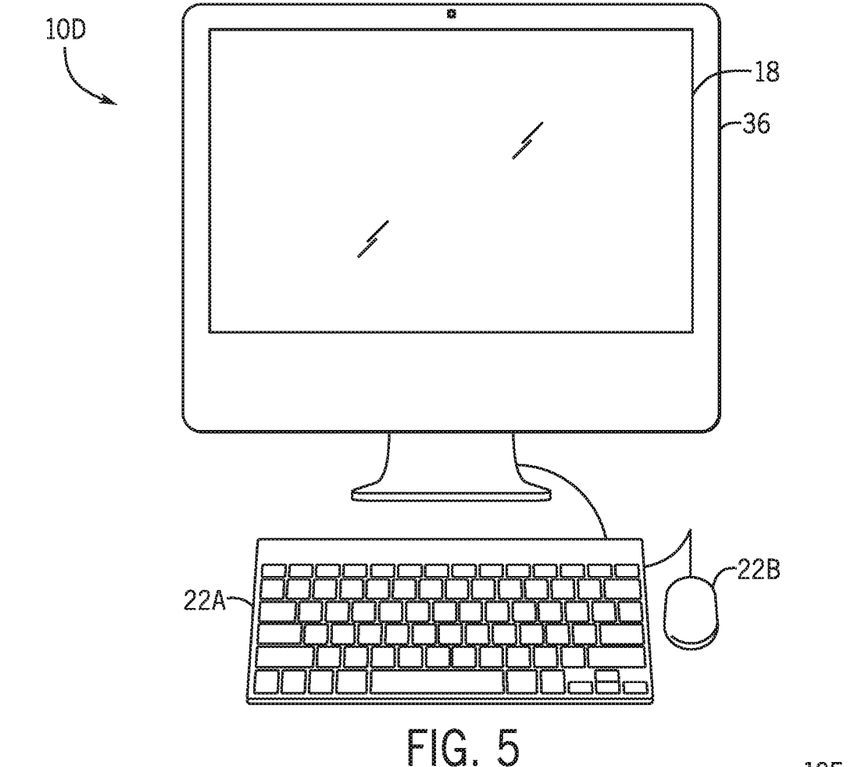
FIG. 5 is a front view of a desktop computer representing another embodiment of the electronic device of FIG. 1.
Figure 6:
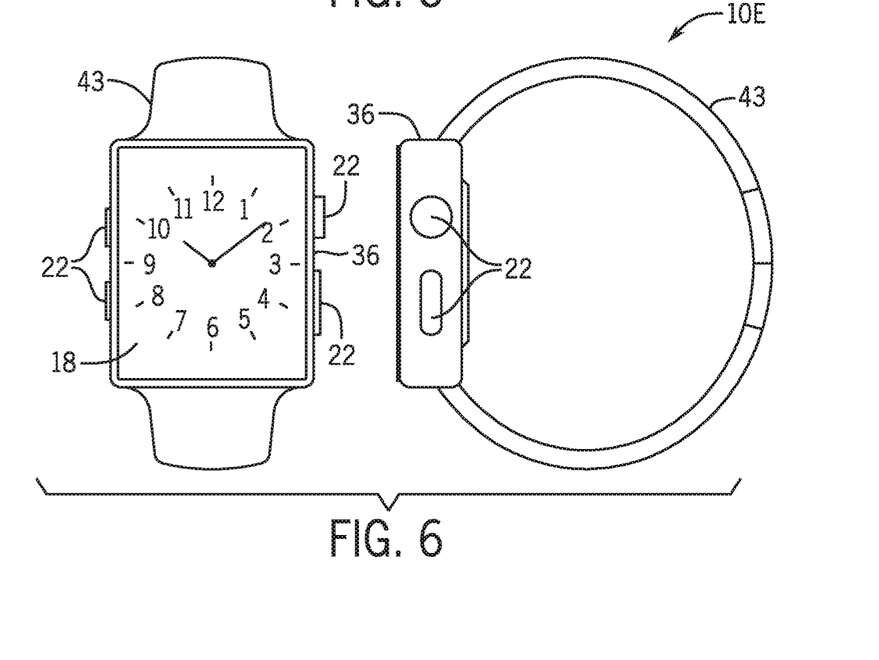
FIG. 6 is a front view and side view of a wearable electronic device representing another embodiment of the electronic device of FIG. 1.

By way of example, the electronic device 10 may represent a block diagram of the notebook computer depicted in FIG. 2, the handheld device depicted in FIG. 3, the handheld device depicted in FIG. 4, the desktop computer depicted in FIG. 5, the wearable electronic device depicted in FIG. 6, or similar devices. It should be noted that the processor(s) 12 and other related items in FIG. 1 may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor(s) 12 may be operably coupled with the memory 14 and the nonvolatile storage 16 to perform various algorithms. Such programs or instructions executed by the processor(s) 12 may be stored in any suitable article of manufacture that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor(s) 12 to enable the electronic device 10 to provide various functionalities.

In certain embodiments, the display 18 may be a liquid crystal display (LCD), which may allow users to view images generated on the electronic device 10. In some embodiments, the display 18 may include a touch screen, which may allow users to interact with a user interface of the electronic device 10. Furthermore, it should be appreciated that, in some embodiments, the display 18 may include one or more organic light emitting diode (OLED) displays, or some combination of LCD panels and OLED panels.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 25.

The network interface 25 may include, for example, one or more interfaces for a personal area network (PAN), such as a Bluetooth network, for a local area network (LAN) or wireless local area network (WLAN), such as an 802.11x Wi-Fi network, and/or for a wide area network (WAN), such as a 3rd generation (3G) cellular network, universal mobile telecommunication system (UMTS), 4th generation (4G) cellular network, long term evolution (LTE) cellular network, a long term evolution license assisted access (LTE-LAA) cellular network, 5th generation (5G) cellular network, and/or 5G New Radio (5G NR) cellular network. The network interface 25 may also include one or more interfaces for, for example, broadband fixed wireless access networks (WiMAX), mobile broadband Wireless networks (mobile WiMAX), asynchronous digital subscriber lines (e.g., ADSL, VDSL), digital video broadcasting-terrestrial (DVB-T) and its extension DVB Handheld (DVB-H), ultra-Wideband (UWB), alternating current (AC) power lines, and so forth. For example, network interfaces 25 may be capable of joining multiple networks, and may employ the one or more antennas 20 to that end.

Additionally or alternatively, the network interfaces 25 may include one or more eFEMs 28. The eFEMs 28 may be used to receive information from a transmitter for the electronic device 10 and/or pass information to a receiver for the electronic device 10. For instance, in some embodiments, the eFEMs 28 may include power amplifiers to receive outgoing signals from the transmitter and amplify the outgoing signals to a transmission level before sending the outgoing signals to the antennas 20. Additionally or alternatively, the eFEMs 28 may include low-noise amplifiers to amplify incoming signals before sending the signals to the receiver. The eFEMs 28 may also provide support for multiple different frequencies and/or standards that may be used by the electronic device 10. The eFEMs 28 may be driven using the one or more RFICs 26.

As further illustrated, the electronic device 10 may include a power source 29. The power source 29 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may include computers that are generally portable (such as laptop, notebook, and tablet computers) as well as computers that are generally used in one place (such as conventional desktop computers, workstations, and/or servers). In certain embodiments, the electronic device 10 in the form of a computer may be a model of a MACBOOK®, MACBOOK® PRO, MACBOOK AIR®, IMAC®, MAC® MINI, OR MAC PRO® available from Apple Inc. By way of example, the electronic device 10, taking the form of a notebook computer 10A, is illustrated in FIG. 2 in accordance with one embodiment of the present disclosure. The depicted computer 10A may include a housing or enclosure 36, a display 18, input structures 22, and ports of an I/O interface 24. In one embodiment, the input structures 22 (such as a keyboard and/or touchpad)

may be used to interact with the computer 10A, such as to start, control, or operate a GUI or applications running on computer 10A. For example, a keyboard and/or touchpad may allow a user to navigate a user interface or application interface displayed on display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an IPOD® OR IPHONE® available from Apple Inc. of Cupertino, Calif. The handheld device 10B may include an enclosure 36 to protect interior components from physical damage and to shield them from electromagnetic interference. The enclosure 36 may surround the display 18. The I/O interfaces 24 may open through the enclosure 36 and may include, for example, an I/O port for a hardwired connection for charging and/or content manipulation using a standard connector and protocol, such as the Lightning connector provided by Apple Inc., a universal serial bus (USB), or other similar connector and protocol.

User input structures 22, in combination with the display 18, may allow a user to control the handheld device 10B. For example, the input structures 22 may activate or deactivate the handheld device 10B, navigate user interface to a home screen, a user-configurable application screen, and/or activate a voice-recognition feature of the handheld device 10B. Other input structures 22 may provide volume control, or may toggle between vibrate and ring modes. The input structures 22 may also include a microphone may obtain a user's voice for various voice-related features, and a speaker may enable audio playback and/or certain phone capabilities. The input structures 22 may also include a headphone input may provide a connection to external speakers and/or headphones.

FIG. 4 depicts a front view of another handheld device 10C, which represents another embodiment of the electronic device 10. The handheld device 10C may represent, for example, a tablet computer, or one of various portable computing devices. By way of example, the handheld device 10C may be a tablet-sized embodiment of the electronic device 10, which may be, for example, a model of an IPAD® available from Apple Inc. of Cupertino, Calif.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an IMAC®, a MACBOOK®, or other similar device by Apple Inc. It should be noted that the computer 10D may also represent a personal computer (PC) by another manufacturer. A similar enclosure 36 may be provided to protect and enclose internal components of the computer 10D such as the display 18. In certain embodiments, a user of the computer 10D may interact with the computer 10D using various input structures 22, such as the keyboard 22A or mouse 22B, which may connect to the computer 10D.

Similarly, FIG. 6 depicts a wearable electronic device 10E representing another embodiment of the electronic device 10 of FIG. 1 that may be configured to operate using the techniques described herein. By way of example, the wearable electronic device 10E, which may include a wristband 38, may be an APPLE WATCH® by Apple Inc. However, in other embodiments, the wearable electronic device 10E may include any wearable electronic device such as, for example, a wearable exercise monitoring device (e.g., pedometer, accelerometer, heart rate monitor), or other device by another manufacturer. The display 18 of the wearable electronic device 10E may include a touch screen display 18 (e.g., LCD, OLED display, active-matrix organic light emitting diode (AMOLED) display, and so forth), as well as input structures 22, which may allow users to interact with a user interface of the wearable electronic device 10E.

Figure 7A:
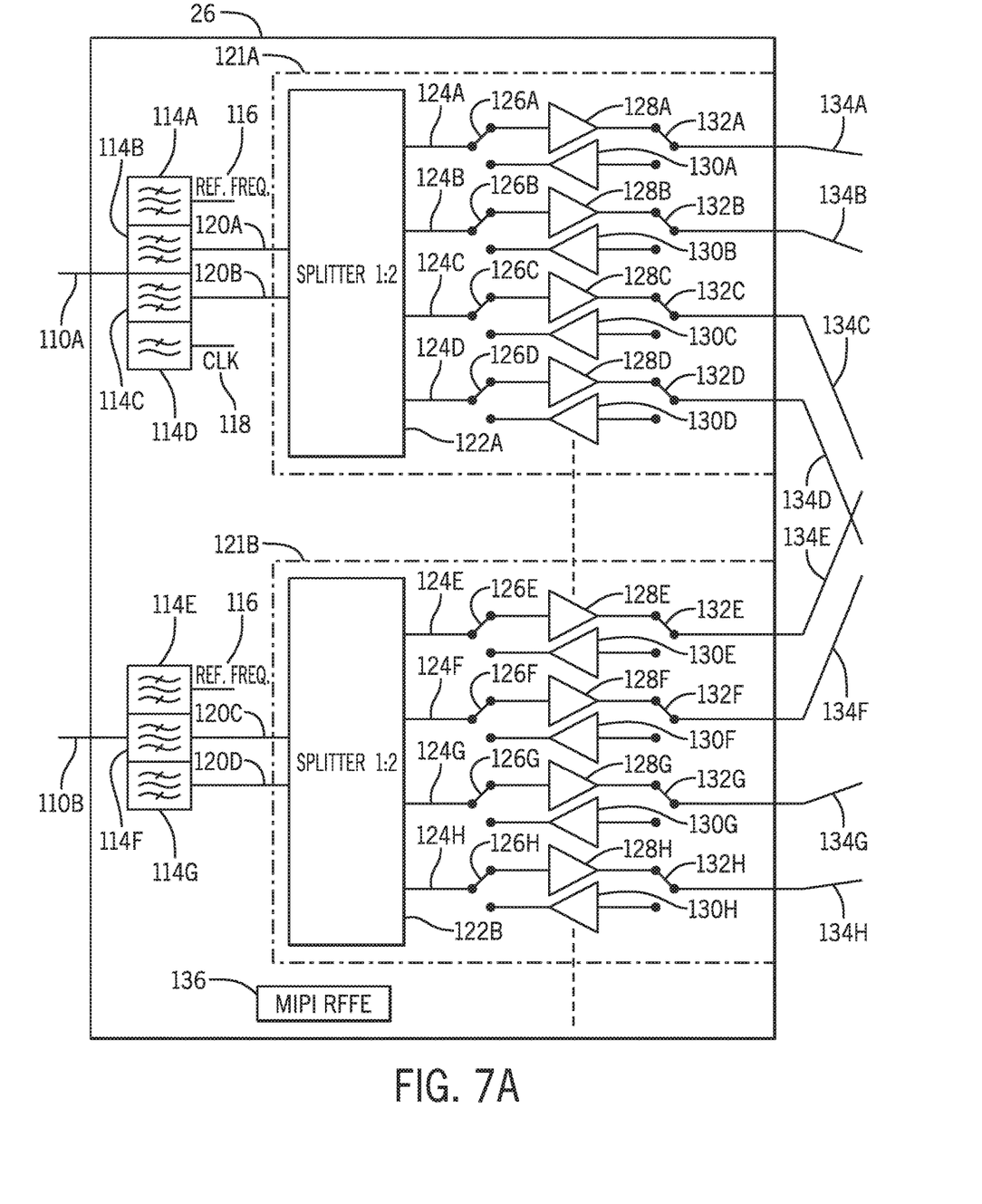
FIG. 7A is a schematic diagram of the RFIC of FIG. 1, in accordance with embodiments of the present disclosure.

As previously noted, the presence of additional RFICs may be impossible or impractical due to size and/or power limitations within the electronic device 10. However, additional eFEMs 28 may need to be driven by some RFIC 26 and the driving resources of the RFIC 26A may be consumed. With the foregoing in mind, the RFICs 26 drive one or more eFEMs 28. FIG. 7A illustrates an embodiment of the RFIC 26 configured to drive one or more eFEMs 28. In a transmission mode, the RFIC 26 receives and/or generates one or more signals 110 that are passed through one or more filters 114A-114G (collectively referred to as filters 114) to generate respective filtered signals 120A-120D (collectively referred to as filtered signals 120). The filters 114 are illustrated as bandpass filters 114A, 114B, 114C, 114E, 114F, and 114G along with a low pass filter 114D to generate the filtered signals 120. However, additional and/or alternative filters types may be included to generate the filtered signals 120. The filters 114 may to pass multiple RF signals in different bands/frequencies, which may include another wireless technology 116 and a modulated control signal 118. In some embodiments and when in a transmission mode, the filters 114 may be used to split the signals 110 into two different frequency signals. In other words, the filtered signals 120 may correspond to different frequencies. For instance, the filtered signals 120A and 120C may be in a high frequency band (e.g., around and including 39 GHz) while the filtered signals 120B and 120D are in a low frequency band (e.g., around and including 28 GHz). In a transmission mode, the filtered signals 120A and 120B are passed to a first sub-component 121A and the filtered signals 120C and 120D are passed to a second sub-component 121B. In the illustrated embodiment, both sub-components 121A and 121B may include a number of RF chains be used to drive a number of RF chains in respective eFEMs 28. The illustrated number of RF chains in a sub-component 121 is four while the two sub-components 121A and 121B together drive eight chains in the eFEM 28. However, in other embodiments, the number of RF chains in a sub-component may be fewer or more than four, causing the number of sub-components in the RFIC 26 to be fewer or more than eight. Furthermore, the RFIC 26 may include more than two sub-components. For example, the RFIC 26 may include four sub-components having four RF chains each thereby causing the RFIC 26 to have a total of sixteen RF chains.

In a transmission mode, the filtered signals 120 are then passed to a respective splitter 122A or 122B (collectively referred to as splitters 122) that splits each of the filtered signals 120 into respective split signals 124A-124H (collectively referred to as split signals 124) for each corresponding RF chain. Although the illustrated splitters 122 are 1:2 splitters, the splitters 122 may split the filtered signals 120 into any suitable number of signals. Moreover, the splitters 122 may include any suitable mechanism for splitting the filtered signals 120 into the respective split signals 124 in a transmission mode and combining signals when in a receive mode. For example, the splitters 122 may include a switch (SW)—such as an single-pole dual-throw (SPDT) switch, an RF divider, and/or other devices suitable for creating two or more copies of an input signal. The split signals 124A and 124C may be split from the filtered signal 120A while the split signals 124B and 124D may be split from the filtered signal 120B. Thus, when the filtered signal 120A has a higher frequency (e.g., 39 GHz) than a frequency (e.g., 28 GHz) of the filtered signal 120B, the split signals 124A and 124C have a higher frequency than the split signals 124B and 124D. For the same reasons regarding the filtered signals 120C and 120D, the split signals 124E and 124G may have a higher frequency than the split signals 124F and 124H.

Since the RF chains may be bidirectional, the RFIC 26 has switches 126A-126H (collectively referred to as switches 126) to control whether the respective split signals 124 are outgoing signals routed to outgoing amplifiers 128A-128H (collectively referred to as outgoing amplifiers 128) or incoming signals routed to incoming amplifiers 130A-130H (collectively referred to as incoming amplifiers 130). When an RF chain is in a transmission mode, a respective switch 126 couples a respective outgoing amplifier 128 to a respective splitter 122. However, when in a receive mode, the same respective switch 126 couples the same incoming amplifier 130 to the same splitter 122. Similar to the switches 126, switches 132A-132H (collectively referred to as switches 132) may be used to selectively couple respective splitters to output ports 134A-134H (collectively referred to as output ports 134). For example, when an RF chain is in a transmission mode, a respective switch 132 couples a respective output port 134 to a respective splitter 122 via a respective outgoing amplifier 128. When the same RF chain is in a receive mode, the same switch 132 couples the same output port 134 to the same splitter 122 via a respective incoming amplifier 130 where the output port 134 receives data from an antenna 20 via a respective eFEM 28. As illustrated, the RFIC 26 may utilize a Mobile Industry Processor Interface (MIPI) group's RF Front-End Control Interface (RFFE) to simplify integration of the eFEMs 28 with operations of the electronic device 10 via the RFIC 26. Additionally or alternatively, another interface may be used to control interaction between the RFIC 26 and the eFEM 28.

Furthermore, as discussed in more detail, below adjacent RF chains may have different frequencies. For example, the RF chains corresponding to the outgoing amplifiers 128A, 128C, 128E, and 128G (and the corresponding incoming amplifiers 130A, 130C, 130E, and 130G) may operate on signals in a low-frequency band while the RF chains corresponding to the outgoing amplifiers 128B, 128D, 128F, and 128H (and the corresponding incoming amplifiers 130A, 130C, 130E, and 130G) may operate on signals in a high-frequency band.

Figure 7B:
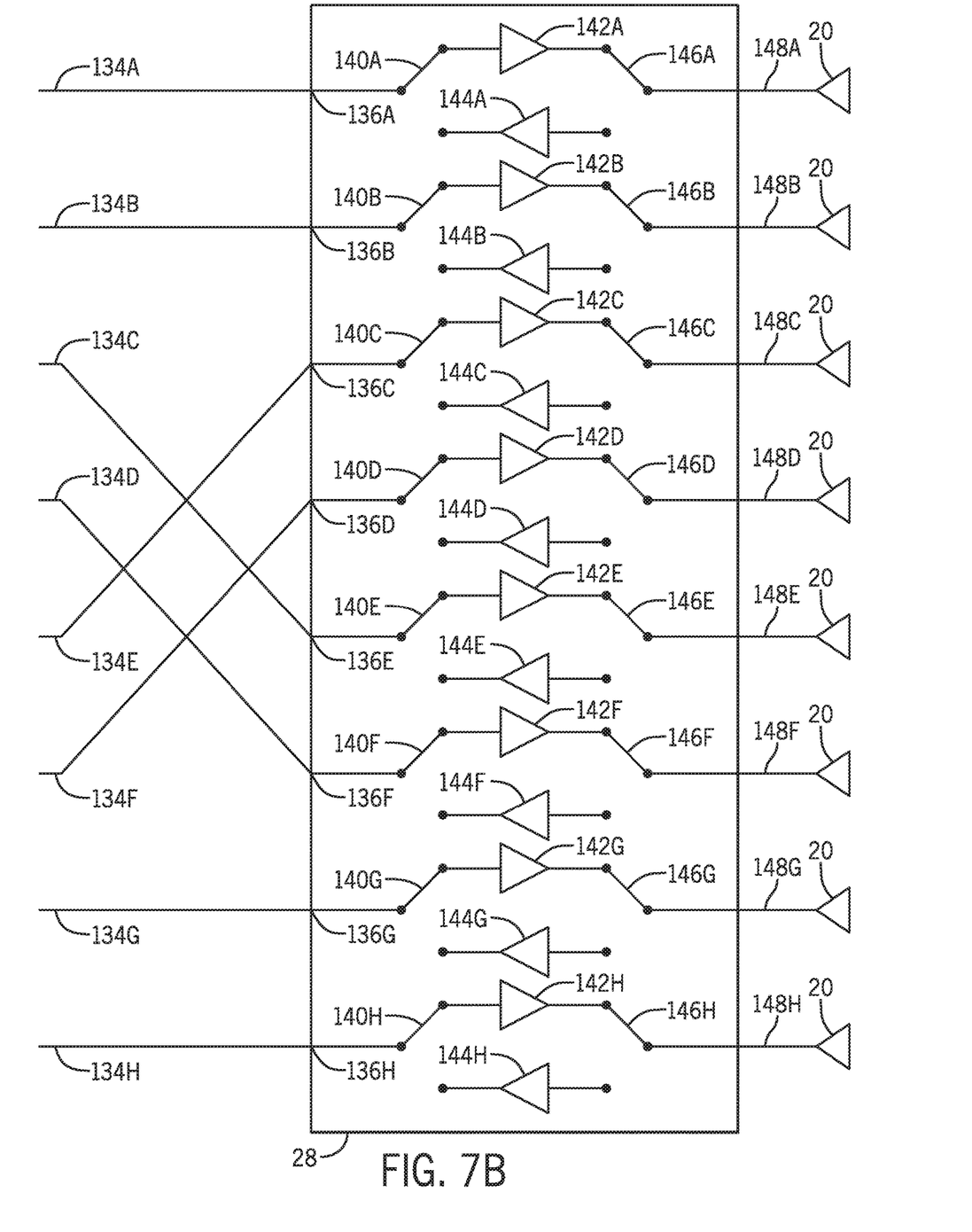
FIG. 7B is a schematic diagram of the eFEM of FIG. 1, in accordance with embodiments of the present disclosure.

FIG. 7B is a schematic diagram of an embodiment of the eFEM 28. As illustrated, the eFEM 28 is coupled to the output ports 134 to receive signals from the RFIC 26 and/or send signals to the eFEM 28. The eFEM 28 includes input ports 136A-136H (collectively referred to as input ports 136), switches 140A-140H (collectively referred to as switches 140), power amplifiers (PAs) 142A-142H (collectively referred to as PAs 142), low-noise amplifiers (LNAs) 144A-144H (collectively referred to as LNAs 144), and switches 146A-146H (collectively referred to as switches 146). The input ports 136 are each coupled to a respective output port 134 of a corresponding RFIC 26. As illustrated, the output ports 134 and the input ports 136 may be coupled linearly in parallel lines and/or coupled in non-parallel manner (e.g., output port 134F is coupled to input port 136C).

Similar to the switches 126, the switches 140 and 146 are used to select between incoming and outgoing transmissions. A pair of switches 140 and 146 couples a respective output port 134 to a respective PA 142 for a transmission mode and couples a respective output port 134 to a respective LNA 144 for a receive mode. The switches 146 are coupled to terminals 148A-148H (collectively referred to as terminals 148). The terminals 148 are coupled to one or more antennas 20 to provide for transmission and/or receipt.

In the foregoing example, each RF chain of an RFIC 26 and drives a corresponding RF chain of the eFEM 28 over a single connection (e.g., through trace from output ports 134). However, the number of terminals in the RFIC 26 may be limited (e.g., 16) to a number of RF chains (e.g., 16 chains). Additional eFEMs 28 may be included to provide additional control and/or flexibility for communications for the electronic device 10. For example, additional eFEMS 28 may be included in the electronic device to provide 5G new radio (NR) functionality. However, each eFEM 28 may include a number (e.g., 8) of RF chains that are available for use by the electronic device 10. Each chain of the eFEMs 28 is driven by a corresponding RFIC 26. However, each RFIC 26 may drive a limited number (e.g., 16 chains) of RF chains using typical connections.

To avoid using an additional RFIC 26, a switching mechanism may be added and/or used in the RFIC 26 to enable the RFIC 26 to drive additional eFEMs. For example, if the switching mechanism includes a dual-pole, dual-throw (DPDT) switch, the existing RF chains in the RFIC 26 may be reused to drive separate eFEMs. The switching mechanism enables the RFIC 26 to potentially double the amount of eFEMs (and RF chains) that it can drive. Furthermore, in addition to doubling the number of eFEMs that the RFIC 26 can support, the amount of trace used in the electronic device 10 may be reduced (e.g., by half). Furthermore, this switching functionality may be at least partially enabled by the adjacent low-frequency and high-frequency RF chains in a sub-component not being used concurrently thereby enabling the inclusion of the DPDT switches to drive a single output from multiple RF chains at one time.

Figure 8:
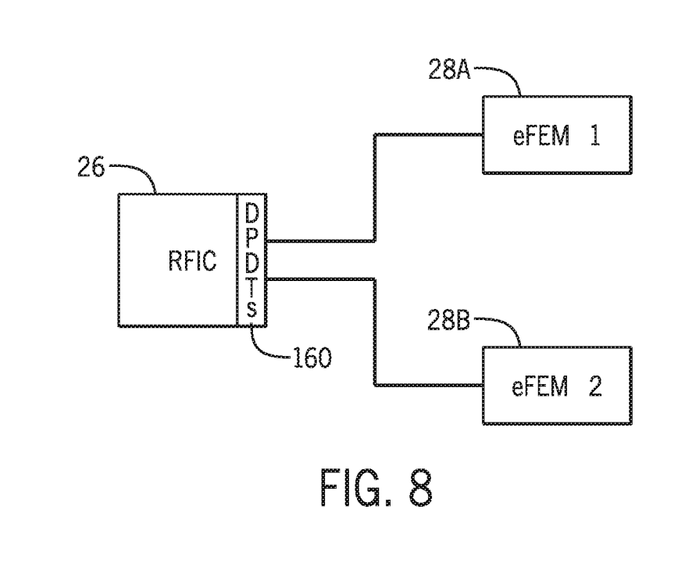
FIG. 8 is a block diagram of the RFIC of FIG. 1 driving two eFEMs using DPDT switches, in accordance with embodiments of the present disclosure.
Figure 9A:
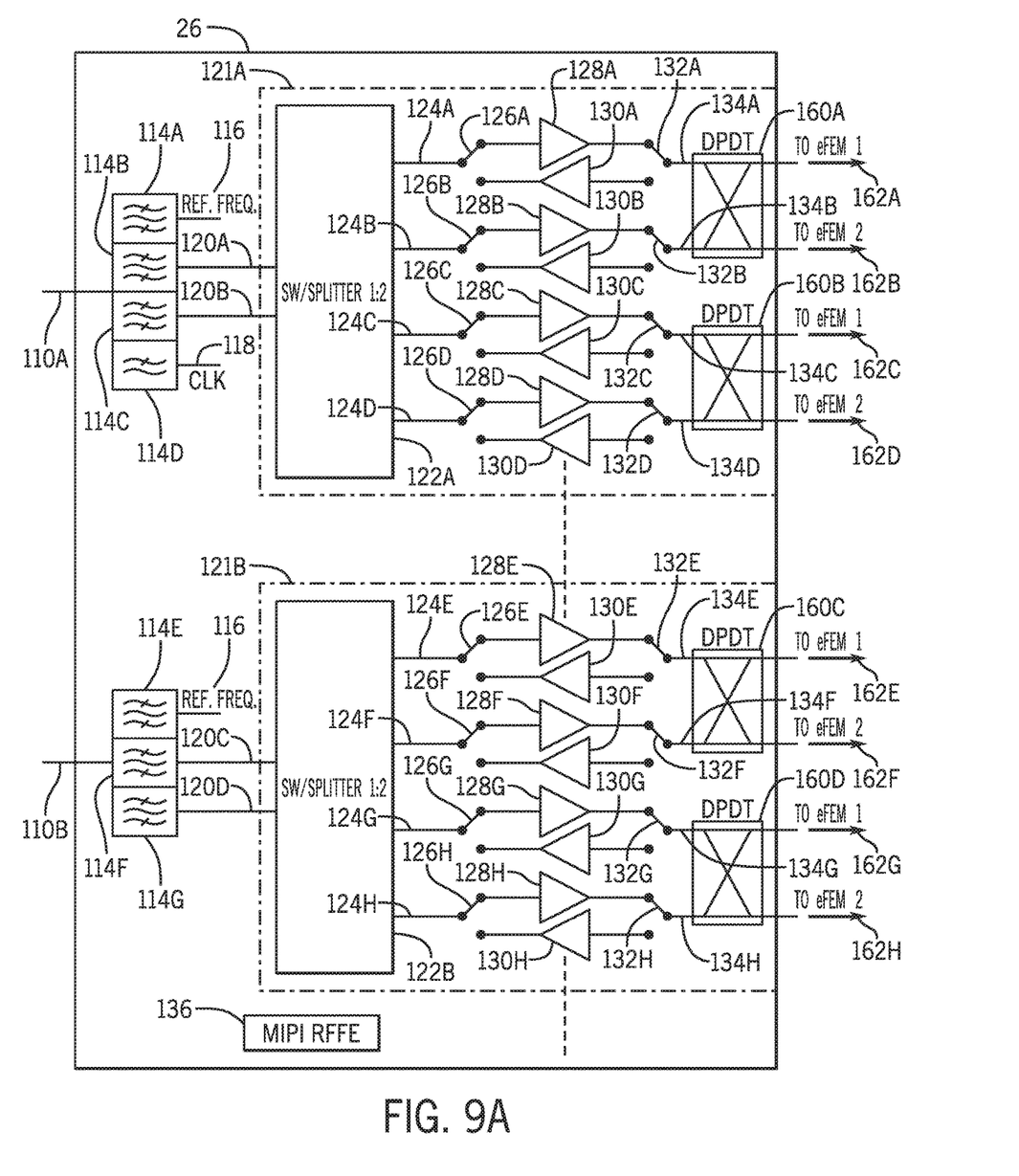
FIG. 9A is a block diagram of the RFIC of FIG. 8, in accordance with embodiments of the present disclosure.

FIG. 8 is a block diagram of a single RFIC 26 using DPDT switches 160 to drive two or more eFEMs 28A and 28B. FIG. 9A is a circuit diagram of an embodiment of the RFIC 26 of FIG. 8 including DPDT switches 160A-160D (collectively referred to as the DPDT switches 160). As illustrated, each of the DPDT switches 160 enable a pair of the outgoing amplifiers 128 and a pair of the incoming amplifiers 130 in adjacent RF chains to be used for two different eFEMs 28. For example, the DPDT switch 160A enables the outgoing amplifiers 128A and 128B and the incoming amplifiers 130A and 130B to be used for eFEMs 28A and 28B via respective output ports 162A and 162B. In other words, the outgoing amplifiers 128A and 128B and the incoming amplifiers 130A and 130B may be utilized for the eFEM 28A via the output port 162A and may be utilized for the eFEM 28B via the output port 162B.

The remaining RF chain pairs may be used similarly to drive RF chains in the eFEMs 28A and 28B. Similar to the DPDT switch 160A, the DPDT switch 160B enables the outgoing amplifiers 128C and 128D and the incoming amplifiers 130C and 130D to be used for eFEMs 28A and 28B via respective output ports 162C and 162D. Likewise, the DPDT switch 160C enables the outgoing amplifiers 128E and 128F and the incoming amplifiers 130E and 130F to be used for eFEMs 28A and 28B via respective output ports 162E and 162F. Furthermore, the DPDT switch 160D enables the outgoing amplifiers 128G and 128H and the incoming amplifiers 130G and 130H to be used for eFEMs 28A and 28B via respective output ports 162G and 162H.

Output ports 162A, 162B, 162C, 162D, 162E, 162F, 162G, and 162H are collectively referred to as output ports 162 herein. Based on the foregoing discussion, due to the inclusion of the DPDT switches, each pair of adjacent RF chains in the RFIC 26 is able to drive two RF chains in each of the respective eFEMs.

Figure 9B:
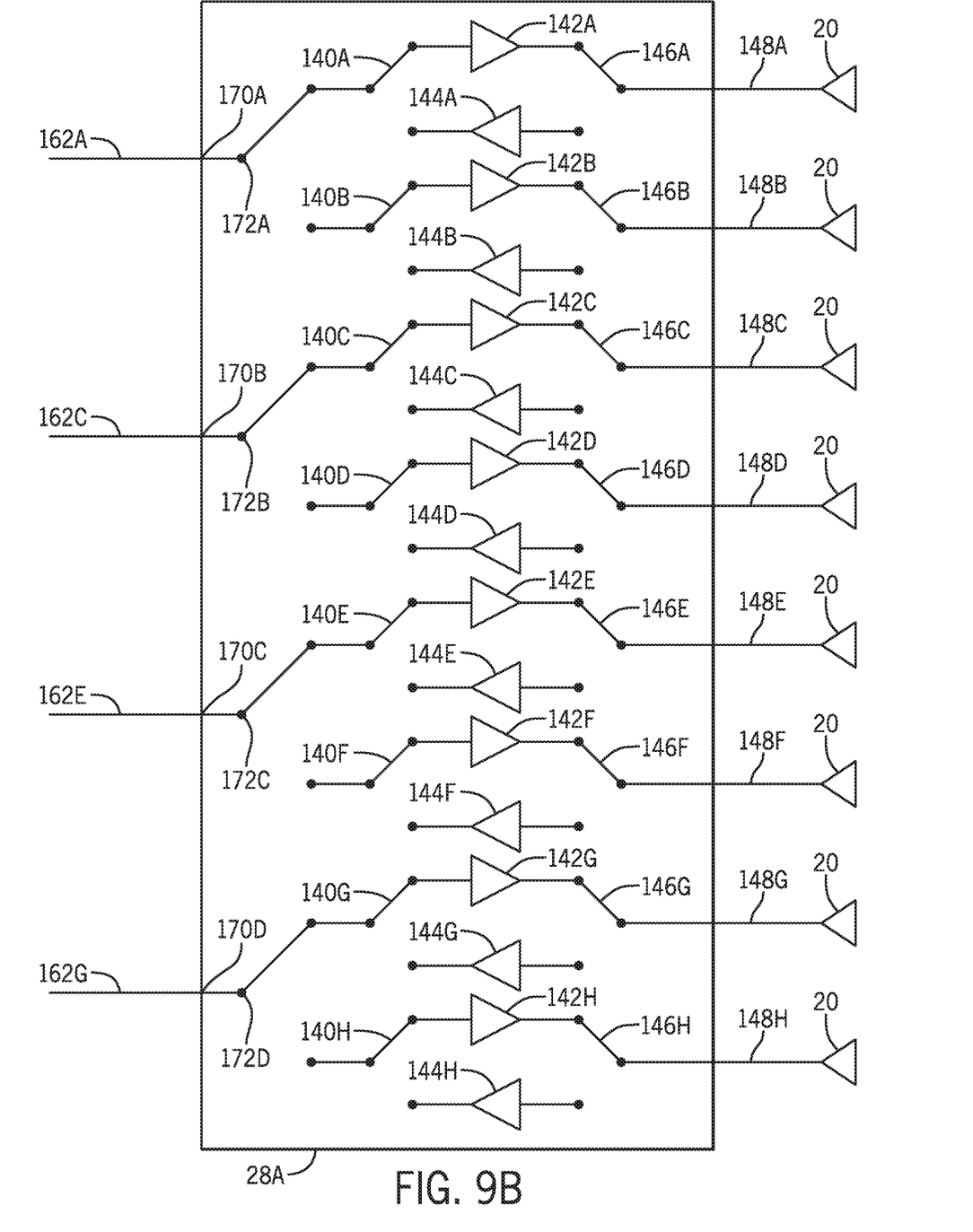
FIG. 9B is a schematic diagram of the first eFEM of FIG. 8, in accordance with embodiments of the present disclosure.

FIG. 9B is a schematic diagram of an embodiment of the eFEM 28A coupled to the RFIC 26 of FIG. 9A via the output ports 162A, 162C, 162E, and 162G. The output ports 162A, 162C, 162E, and 162G are coupled to respective input ports 170A, 170B, 170D, and 170E (collectively referred to as input ports 170). Since the connection between respective output ports 162 of the RFIC 26 and the input ports 170 carry data for more than one RF chain in the RFIC 26, the eFEM 28A includes switches 172A, 172B, 172C, and 172D (collectively referred to as switches 172) each coupled to two respective RF chains in the eFEM 28A. The switches 172 are configured to route data through a RF chain in the eFEM 28A that corresponds to the RF chain used in the RFIC 26.

Figure 9C:
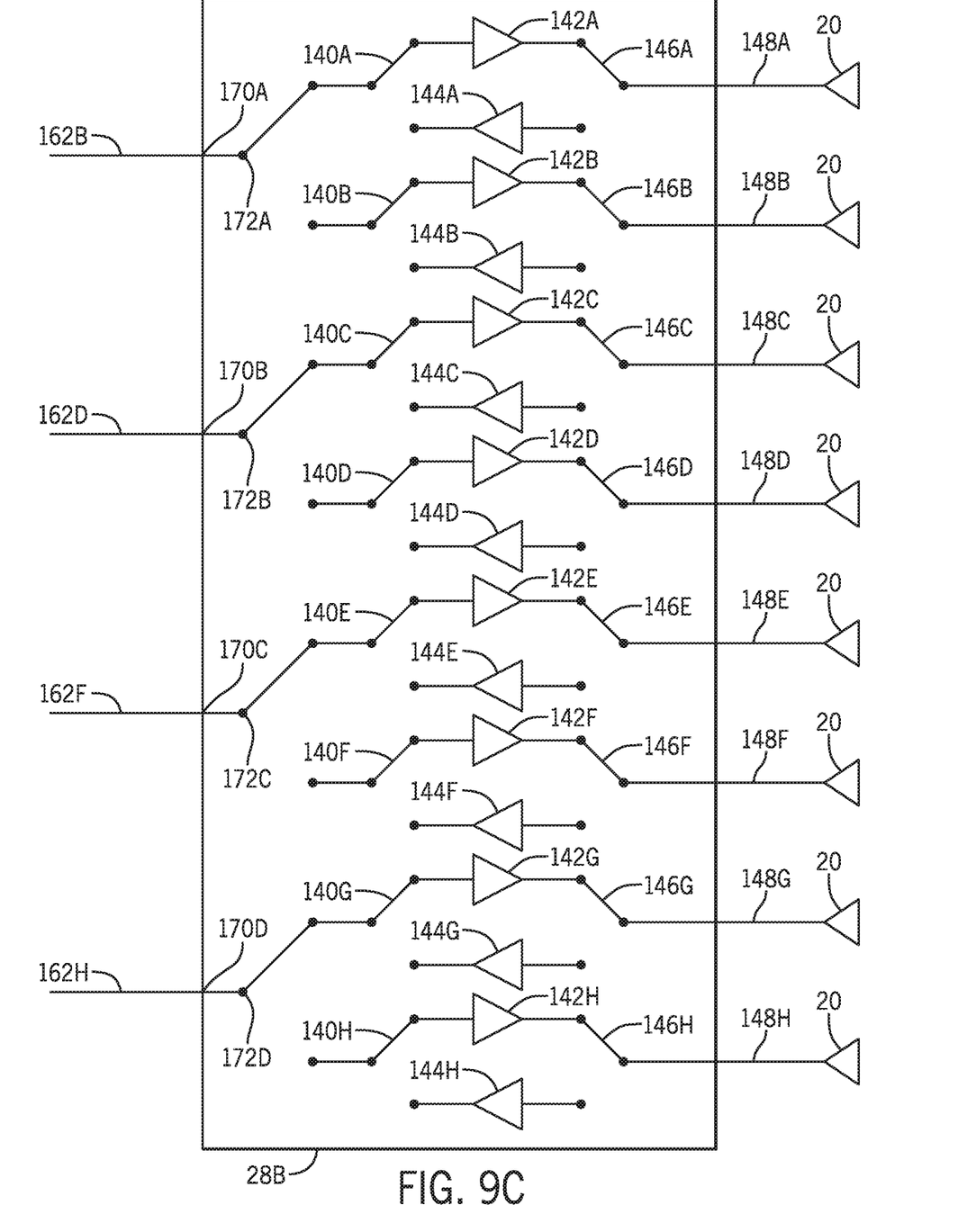
FIG. 9C is a schematic diagram of the second eFEM of FIG. 8, in accordance with embodiments of the present disclosure.

FIG. 9C is a schematic diagram of an embodiment of the eFEM 28B coupled to the RFIC 26 of FIG. 9A via the output ports 162B, 162D, 162F, and 162H. The output ports 162B, 162D, 162F, and 162H are coupled to the respective input ports 170A, 170B, 170D, and 170E. Again, since the connection between respective output ports 162 of the RFIC 26 and the input ports 170 carry data for more than one RF chain in the RFIC 26, the eFEM 28B includes switches 172A, 172B, 172C, and 172D each coupled to two respective RF chains in the eFEM 28B. The switches 172 are configured to route data through a RF chain in the eFEM 28B that corresponds to the RF chain used in the RFIC 26.

Since each pair of RF chains in the RFIC 26 can drive corresponding pairs of RF chains in two different eFEMs 28 (e.g., eFEMs 28A and 26B), each RF chain pair in the RFIC 26 can drive four RF chains. Furthermore, since the RFIC 26 may have more RF chains than the eFEMs 28, some of the RF chains in the RFIC 26 may be made available for other eFEMs 28.

Figure 10:
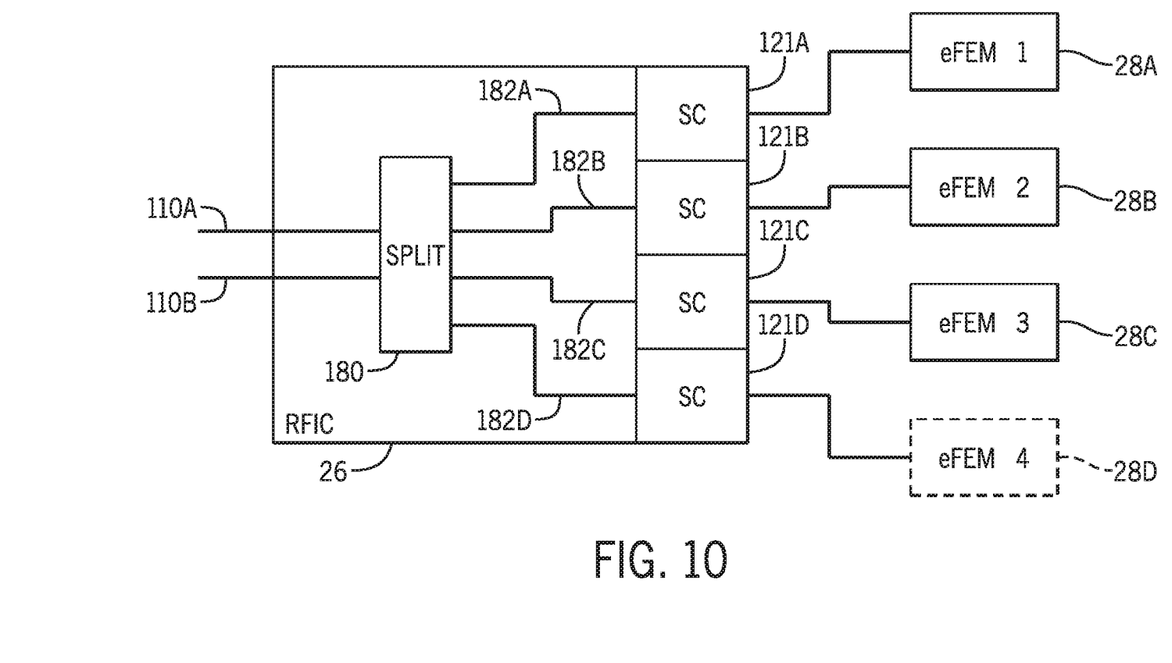
FIG. 10 is a block diagram the RFIC of FIG. 1 driving three eFEMs using splitting circuitry, in accordance with embodiments of the present disclosure.

For example, FIG. 10 is a block diagram of the RFIC 26 driving eFEMs 28A, 28B, and 28C via the DPDT switches 160. Additionally or alternatively, another eFEM 28D may be driven by the RF chains of the RFIC 26 used to drive the RF chains of the eFEM 28C. To handle the additional splitting for the signals 110 being sent to four sub-components 121A, 121B, 121C, and 121D, the RFIC 26 utilizes splitting circuitry 180 to generate and/or combine signals 182A, 182B, 182C, and 182D. Furthermore, each of the signals 182A, 182B, 182C, and 182D may include one or more signals. For example, the signal 182A may include the filtered signals 120A and 120B of FIGS. 9 and 12.

Figure 11A:
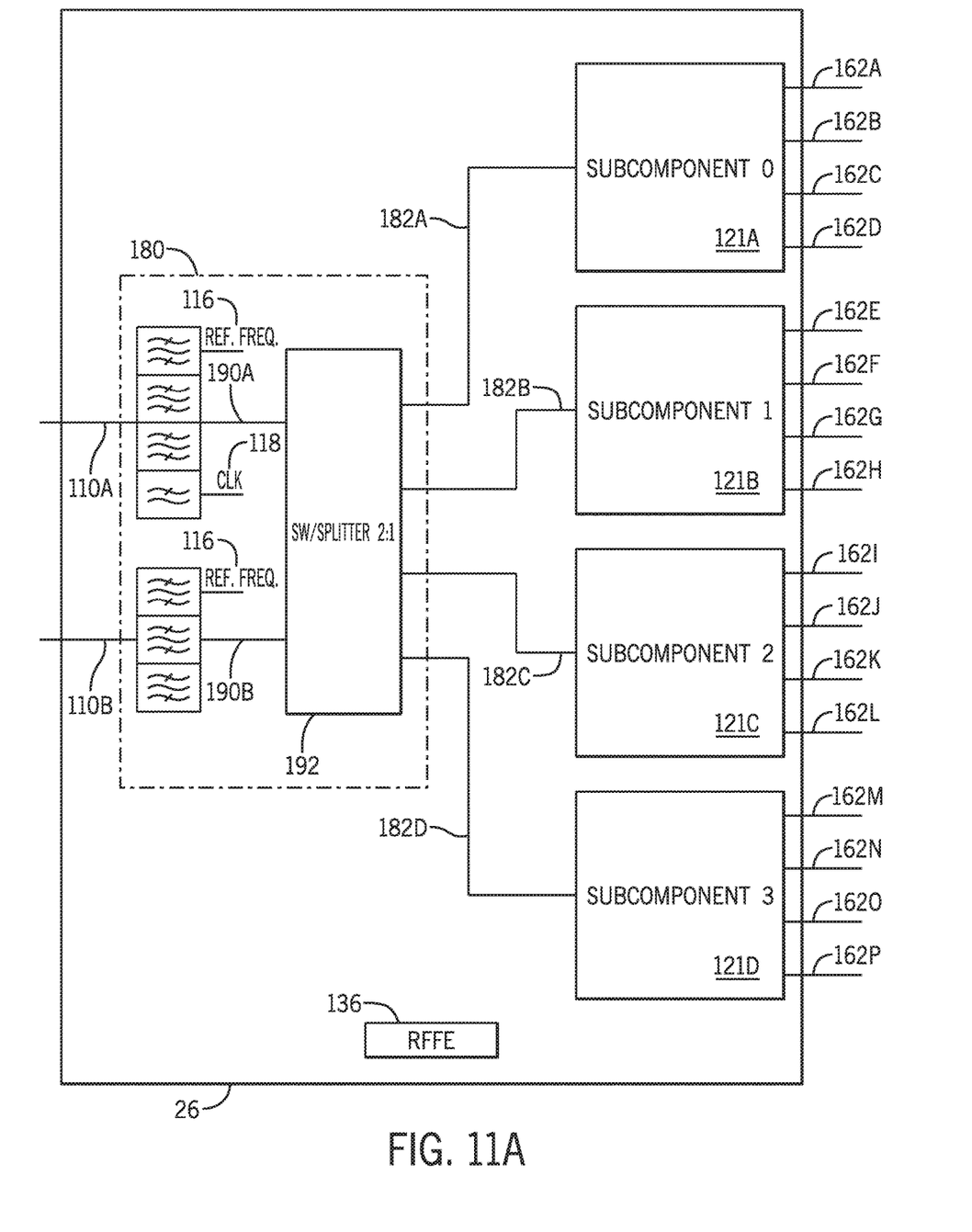
FIG. 11A is a diagram of the RFIC of FIG. 10, in accordance with embodiments of the present disclosure.

FIG. 11A is a block diagram of the RFIC 26 that includes the splitting circuitry 180 and the four sub-components 121A, 121B, 121C, and 121D. The splitting circuitry 180 includes the filters 114 that use the reference frequency 116 and the clock 118 to derive the signals 190A and 190B. The splitting circuitry 180 may include a splitter 192 that be similar to the splitters 122. For instance, the splitter 192 may include a switch (SW), an RF divider, and/or other devices suitable for creating two or more copies of an input signals 190A and 190B. The splitter 192 that may be used to split the signals 190A and 190B to generate the signals 182A, 182B, 182C, and 182D or to combine the signals 182A, 182B, 182C, and 182D to generate the signals 190A and 190B. For example, the signals 182A and 182B may be split from signal 190A, and the signals 182C and 182D may be split from signals 190B. The sub-components 121A and 121B generate the signals at outputs 162A-162H, as previously discussed in relation to FIG. 9A.

Figure 11B:
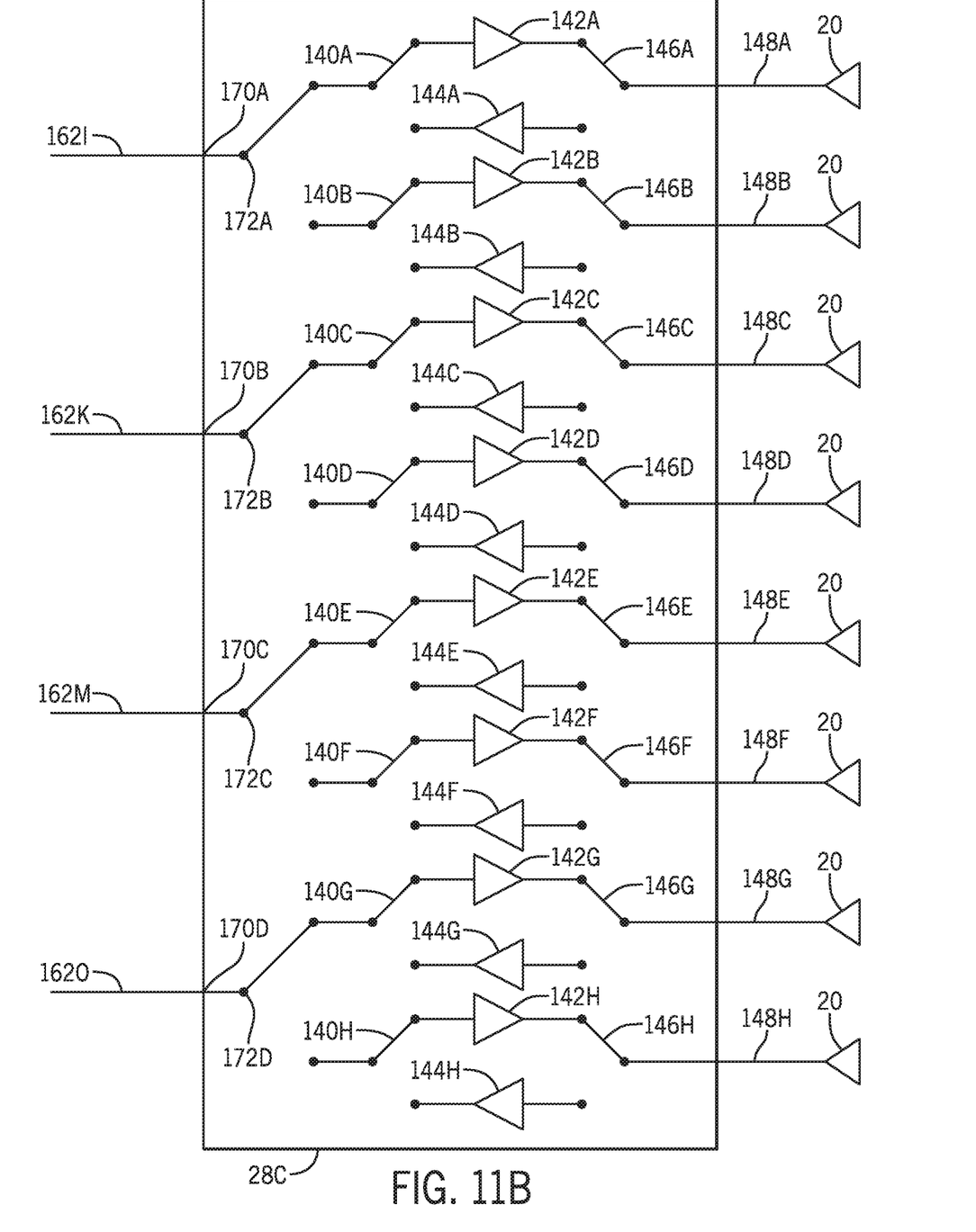
FIG. 11B is a diagram of one of the eFEMs of FIG. 10, in accordance with embodiments of the present disclosure.

Sub-components 121C and 121D function similar to the sub-components 121A and 121B. However, the sub-components 121C and 121D generate outputs 1621-162P to drive eFEM 28C (and eFEM 28D). FIG. 11B is a schematic diagram of the eFEM 28C that couples the switch 172A to the output port 162I, the switch 172B to the output port 162K, the switch 172C to the output port 162M, and the switch 172D to the output port 162O. Other than using the output ports 162I, 162K, 162M, and 162O instead of the output ports 162A, 162C, 162E, and 162G, the eFEM 28C functions similar to the eFEM 28A discussed in relation to FIG. 9B. Furthermore, the eFEM 28D functions similar to the eFEM 28C except that the eFEM 28D couples the switches 172A, 172B, 172C, and 172D to the respective output ports 162J, 162L, 162N, and 162P.

The specific embodiments described above have been shown by way of example, and it should be understood that these embodiments may be susceptible to various modifications and alternative forms. For example, the methods may be applied for embodiments having different numbers and/or locations for antennas, different groupings, and/or different networks. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electronic device, comprising:
a front-end module (FEM) comprising a plurality of FEM radio-frequency (RF) chains that enable the electronic device to utilize a plurality of frequency bands;
a radio-frequency integrated circuit (RFIC) comprising:
a plurality of RFIC RF chains configured to drive the plurality of FEM RF chains; and
a plurality of dual-pole, dual-throw (DPDT) switches, where each of a first subset of the plurality of DPDT switches enables a pair of RFIC RF chains of the plurality of RFIC RF chains to drive a respective pair of FEM RF chains of the plurality of FEM RF chains via a respective transmission line.

2. The electronic device of claim 1, comprising a secondary FEM comprising a secondary plurality of FEM RF chains that enable the electronic device to utilize a secondary plurality of frequency bands.

3. The electronic device of claim 2, wherein each of first subset of the DPDT switches enables the pair of the plurality of RFIC RF chains to drive a respective pair of the secondary plurality of FEM RF chains.

4. The electronic device of claim 3, comprising a tertiary FEM comprising a tertiary plurality of FEM RF chains that enable the electronic device to utilize a tertiary plurality of frequency bands.

5. The electronic device of claim 4, wherein each of a second subset of the DPDT switches enables a secondary pair of the plurality of RFIC RF chains to drive a respective pair of the tertiary plurality of FEM RF chains.

6. The electronic device of claim 5, comprising a quaternary FEM comprising a quaternary plurality of FEM RF chains that enable the electronic device to utilize a quaternary plurality of frequency bands.

7. The electronic device of claim 6, wherein each of the second subset of the DPDT switches enables the secondary pair of the plurality of RFIC RF chains to drive a respective pair of the quaternary plurality of FEM RF chains.

8. The electronic device of claim 1, wherein each of the plurality of RFIC RF chains comprises an incoming amplifier and an outgoing amplifier.

9. The electronic device of claim 8, wherein each of the plurality of RFIC RF chains comprises a pair of switches configured to selectively route signals through the incoming amplifier or the outgoing amplifier.

10. The electronic device of claim 1, wherein each of the plurality of FEM RF chains comprises a low-noise amplifier (LNA), a power amplifier (PA), and a pair of switches configured to selectively route signals through the LNA or the PA.

11. The electronic device of claim 10, wherein the FEM comprises an external FEM that is external to the RFIC.

12. An electronic device, comprising:
a radio-frequency integrated circuit (RFIC), comprising a plurality of dual-pole, dual-throw (DPDT) switches;
a first front-end module (FEM) driven using the RFIC;
a second FEM driven using the RFIC; and
a third FEM driven using the RFIC.

13. The electronic device of claim 12, wherein the RFIC comprises a plurality of RF chains, and wherein a set of RF chains of the plurality of RF chains of the RFIC is configured to select between FEM RF chains in the first FEM or FEM RF chains in the second FEM.

14. The electronic device of claim 12, wherein a first set of sub-components of the RFIC comprising a first set of the plurality of DPDTs are configured to drive the first and second FEMs.

15. The electronic device of claim 14, wherein a second set of the sub-components of the RFIC comprising a second set of the plurality of DPDTs are configured to drive third FEM.

16. The electronic device of claim 15, wherein the RFIC comprises splitting circuitry that is configured to:
receive an input signal;
split the input signal; and
transmit the split input signals to the first and second sets of sub-components.

17. The electronic device of claim 16, wherein the splitting circuitry comprises a switch configured to split the input signal.

18. A method, comprising:
receiving an input signal at a radio-frequency integrated circuit (RFIC);
splitting the input signal into split signals;
transmitting the split signals to respective sub-components of the RFIC;
routing at least a first portion of the split signals from a first set of the sub-components in the RFIC to a first front-end module (FEM) using a first set of dual-pole, dual-throw (DPDT) switches; and
routing at least a second portion of the split signals from the first set of the sub-components in the RFIC to a second FEM using the first set of DPDT switches.

19. The method of claim 18, comprising routing at least a third portion of the split signals from a second set of the sub-components to a third FEM using a second set of DPDT switches.

20. The method of claim 19, comprising routing at least a fourth portion of the split signals from the second set of the sub-components to a fourth FEM using the second set of DPDT switches.

* * * * *